US012658593B2

(12) United States Patent
Wang

(10) Patent No.: US 12,658,593 B2
(45) Date of Patent: Jun. 16, 2026

(54) ELECTRONIC DEVICE

(71) Applicant: VIVO MOBILE COMMUNICATION CO., LTD., Guangdong (CN)

(72) Inventor: Junyi Wang, Guangdong (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 105 days.

(21) Appl. No.: 18/639,490

(22) Filed: Apr. 18, 2024

(65) Prior Publication Data

US 2024/0266747 A1 Aug. 8, 2024

Related U.S. Application Data

(63) Continuation of application No. PCT/CN2022/125923, filed on Oct. 18, 2022.

(30) Foreign Application Priority Data

Oct. 20, 2021 (CN) .......................... 202111220072.3

(51) Int. Cl.
*H01Q 1/24* (2006.01)
*H01Q 1/38* (2006.01)
(Continued)

(52) U.S. Cl.
CPC .............. *H01Q 13/18* (2013.01); *H01Q 1/38* (2013.01); *H05K 9/0024* (2013.01); *H01Q 1/241* (2013.01)

(58) Field of Classification Search
CPC .......... H01Q 13/18; H01Q 1/38; H01Q 1/241; H01Q 1/526; H01Q 1/50; H05K 9/0024; H05K 9/0007
See application file for complete search history.

(56) References Cited

U.S. PATENT DOCUMENTS

2007/0080864 A1* 4/2007 Channabasappa ... H01Q 9/0442
343/700 MS
2014/0125528 A1 5/2014 Tsai et al.
(Continued)

FOREIGN PATENT DOCUMENTS

CN 105449355 A 3/2016
CN 110544822 A 12/2019
(Continued)

OTHER PUBLICATIONS

European Search Report for Application No. 22882854.7, Feb. 4, 2025, 10 pages.
(Continued)

*Primary Examiner* — David E Lotter
(74) *Attorney, Agent, or Firm* — BROOKS KUSHMAN P.C.

(57) ABSTRACT

An electronic device, including: a shielding cover, provided with a first metal layer; a second metal layer, spaced apart from the first metal layer, where a slot is provided on the second metal layer, and the second metal layer is disposed outside the shielding cover; a metal member, disposed between the first metal layer and the second metal layer, where the metal member forms a resonant cavity in a manner of enclosing, and the metal member is electrically connected to the first metal layer and the second metal layer separately, and the first metal layer and the second metal layer form a first resonant cavity antenna; and a feeding structure, configured to feed the resonant cavity.

12 Claims, 12 Drawing Sheets

(51) Int. Cl.
  *H01Q 13/18*     (2006.01)
  *H05K 9/00*     (2006.01)

(56)          References Cited

U.S. PATENT DOCUMENTS

2019/0097306 A1 * 3/2019 Romano ................ H01Q 13/10
2021/0376488 A1 * 12/2021 Rogers .................... H01Q 1/48

FOREIGN PATENT DOCUMENTS

| | | |
|---|---|---|
| CN | 112993579 A | 6/2021 |
| CN | 113054425 A | 6/2021 |
| CN | 113964483 A | 1/2022 |
| JP | 2004015160 A | 1/2004 |

OTHER PUBLICATIONS

International Search Report and Written Opinion for PCT Application No. PCT/CN2022/125923, Mailed Dec. 16, 2022, 14 pages.

* cited by examiner 20                33

20

21

11 a

21

21

ELECTRONIC DEVICE

CROSS-REFERENCE TO RELATED APPLICATIONS

This application is a continuation of International Application No. PCT/CN2022/125923 filed on Oct. 18, 2022, which claims priority to Chinese Patent Application No. 202111220072.3 filed on Oct. 20, 2021, which are incorporated herein by reference in their entireties.

TECHNICAL FIELD

This application belongs to the field of terminal technologies, and in particular relates to an electronic device.

BACKGROUND

In related technologies, there are an increasing number of antennas and an increasing number of frequency bands for the antennas in mobile terminals in a fifth generation mobile communication (5G). The antennas are arranged around the mobile terminal in an extremely crowded manner, and a plurality of problems such as isolation between antennas occur, which directly affects antenna performance. Therefore, in a case that space for an entire mobile terminal is not changed, it is particularly important to fully use the space. Generally, a shielding cover is used only as a separate shielding structure, and space above the shielding cover cannot be used, so that the space for the entire mobile terminal cannot be fully used.

SUMMARY

Embodiments of this application are intended to provide an electronic device.

An embodiment of this application provides an electronic device, including:

a shielding cover, provided with a first metal layer;

a second metal layer, spaced apart from the first metal layer, where a slot is provided on the second metal layer, and the second metal layer is disposed outside the shielding cover; and a metal member, where the metal member is disposed between the first metal layer and the second metal layer, the metal member forms a resonant cavity in a manner of enclosing, the metal member is electrically connected to the first metal layer and the second metal layer separately, and the first metal layer and the second metal layer form a first resonant cavity antenna; and a feeding structure, where the feeding structure is configured to feed the resonant cavity.

Optionally, the metal member extends in a circumferential direction of the second metal layer; or there are a plurality of metal members, and the plurality of metal members are spaced apart from each other in a circumferential direction of the second metal layer.

Optionally, the metal member includes:

a first metal member, where the first metal member is electrically connected to the first metal layer and the second metal layer separately, and the first metal member is disposed in a circumferential direction of the second metal layer, and forms a first resonant cavity in a manner of enclosing; and a second metal member, where the second metal member is electrically connected to the first metal layer and the second metal layer separately, the second metal member is disposed in the circumferential direction of the second metal layer and forms a second resonant cavity in a manner of enclosing, and the second resonant cavity is located in the first resonant cavity.

Optionally, there are a plurality of second metal members, and the second metal members are distributed on two sides of the slot.

Optionally, a dielectric layer is filled between the first metal layer and the second metal layer.

Optionally, the second metal layer is provided with a plurality of slots, and the plurality of slots are distributed at intervals; and/or the slot is strip-shaped, arc-shaped, annular, or L-shaped; and/or the slot is located at an edge area of the second metal layer; and/or the resonant cavity is cylindrical, elliptic-cylinder-shaped, or polyhedron-shaped.

Optionally, a length of the slot is half an operating wavelength of a radio frequency signal in a medium in the slot.

Optionally, the slot is strip-shaped, and a ratio of a length of the slot to a width of the slot is greater than or equal to 10.

Optionally, the slot may extend inwardly from one side edge of the second metal layer and penetrate from the other side edge of the second metal layer.

Optionally, the electronic device further includes:

a third metal layer, where the third metal layer is disposed between the first metal layer and the second metal layer and is located in the resonant cavity, the third metal layer is spaced apart from the first metal layer and the second metal layer separately, and an edge of the third metal layer is electrically connected to the metal member.

Optionally, the metal member extends in a circumferential direction of the second metal layer, the third metal layer is rectangular-shaped, and two adjacent edges of the third metal layer are both electrically connected to the metal member.

Optionally, there are a plurality of shielding covers, there are a plurality of second metal layers, and a first metal layer of each shielding cover and one corresponding second metal layer form one of the first resonant cavity antennas.

Optionally, there are a plurality of shielding covers, there is one second metal layer, and first metal layers on the plurality of shielding covers are all disposed corresponding to the second metal layer to form the first resonant cavity antennas.

Optionally, a plurality of the resonant cavities are formed between the first metal layer and the second metal layer, and the slots are respectively disposed at positions, corresponding to the resonant cavities, on the second metal layer.

Optionally, the electronic device further includes a feeding structure. The feeding structure is configured to feed the resonant cavity.

Optionally, the electronic device further includes a tuning element. The feeding structure feeds the resonant cavity through the tuning element.

Optionally, the electronic device further includes a main board. The shielding cover is disposed on the main board.

Optionally, the electronic device further includes a first antenna. The first antenna is disposed on the second metal layer.

Optionally, the electronic device further includes a second antenna. The second antenna is disposed at an edge area of the electronic device.

Optionally, the electronic device further includes a battery and a back cover. The battery and the back cover are spaced apart in a thickness direction of the battery, and a second resonant cavity antenna is disposed between the battery and the back cover.

Optionally, the electronic device further includes a display screen and a frame. The display screen is disposed on the frame, and a third resonant cavity antenna is disposed between the display screen and the frame.

Figures 1A, 1B:
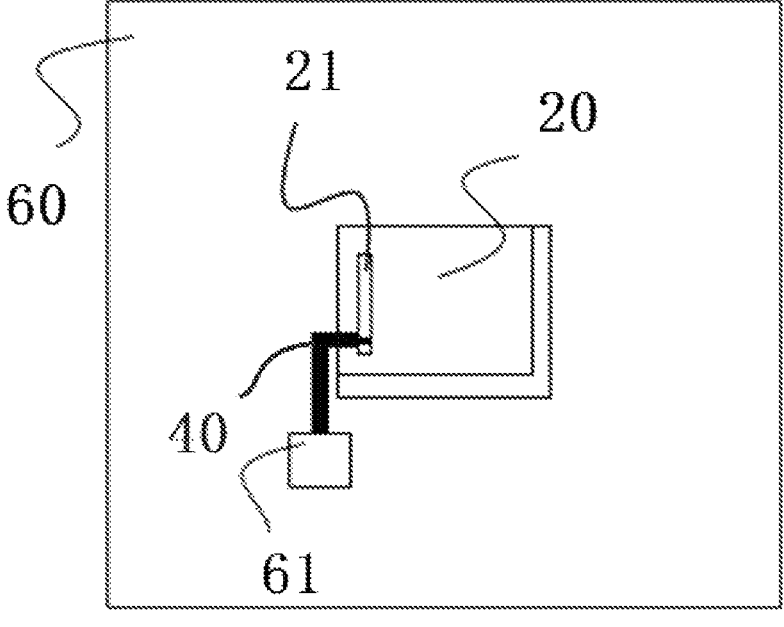
FIG. 1a is a schematic structural diagram of an electronic device according to an embodiment of this application.
FIG. 1b is a side view of an electronic device according to an embodiment of this application.

REFERENCE SIGNS shielding cover 10; first metal layer 11; dielectric layer 12;
second metal layer 20; slot 21;
metal member 30; second metal member 32; third metal layer 33;
feeding structure 40; flexible circuit board 51;
tuning element 50; main board 60; radio frequency module 61;

first antenna 70; second antenna 80; flexible circuit board 81;
battery 90.

DETAILED DESCRIPTION

The following clearly describes technical solutions in embodiments of this application with reference to accompanying drawings in the embodiments of this application. Apparently, the described embodiments are some but not all of the embodiments of this application. All other embodiments obtained by a person of ordinary skill in the art based on the embodiments of this application shall fall within the protection scope of this application.

The terms "first", "second", and the like in this specification and claims of this application are used to distinguish between similar objects instead of describing a specific order or sequence. It should be understood that the data used in such a way is interchangeable in proper circumstances so that the embodiments of this application can be implemented in an order other than the order illustrated or described herein. In addition, in this specification and the claims, "and/or" represents at least one of connected objects, and a character "/" generally represents an "or" relationship between associated objects.

With reference to FIG. 1a to FIG. 10, an electronic device provided in embodiments of this application is described in detail by using specific embodiments and application scenarios for the embodiments.

As shown in FIG. 1a to FIG. 10, the electronic device in the embodiments of this application includes a shielding cover 10, a second metal layer 20, a metal member 30, and a feeding structure 40. The shielding cover 10 is provided with a first metal layer 11, and the first metal layer 11 may include at least one surface of the shielding cover 10. The shielding cover 10 may be soldered on a main grounding layer of a main board, and may perform electromagnetic shielding on a chip module or a discrete power amplifier component on the main board, which has a shielding function. The first metal layer 11 may be located at the top of the shielding cover 10, that is, a side away from the main board.

The second metal layer 20 may be spaced apart from the first metal layer 11, and the second metal layer 20 and the first metal layer 11 may be disposed in parallel. The thickness of the second metal layer 20 may be 0.5 mm-2 mm. The second metal layer 20 is disposed outside the shielding cover 10. The second metal layer 20 may be provided with a slot 21. A quantity of the slots 21 may be one or more. The quantity, a shape, and positions of the slots 21 may be selected based on an actual situation. The metal member 30 may be disposed between the first metal layer 11 and the second metal layer 20, and the metal member 30 may form a resonant cavity in a manner of enclosing. The slot 21 may be disposed at a position that is on the second metal layer 20 and that is corresponding to the resonant cavity. The metal member 30 may extend in a circumferential direction of the second metal layer 20, and the metal member 30 may extend in an edge area of the second metal layer 20. The metal member 30 may be circular or arc-shaped, and the metal member 30 may be electrically connected to the second metal layer 20 and the first metal layer 11 respectively. The first metal layer 11 and the second metal layer 20 may form a first resonant cavity antenna. The feeding structure 40 may be configured to feed the resonant cavity, and a signal may be fed to the resonant cavity by using the feeding structure 40. A radio frequency signal may be radiated from the slot 21 after being subject to resonance of the resonant cavity, and an antenna with high radiation efficiency may be implemented above the shielding cover 10.

In the electronic device in the embodiments of this application, the metal member 30 is disposed between the first metal layer 11 of the shielding cover 10 and the second metal layer 20, and the metal member 30 may form the resonant cavity in a manner of enclosing. The slot 21 is provided on the second metal layer 20, and the first metal layer 11 and the second metal layer 20 form the first resonant cavity antenna, so that an antenna with high radiation efficiency may be disposed above the shielding cover 10. An additional high-performance antenna is provided by using space above the shielding cover 10, and the space above the shielding cover 10 is fully used. The first metal layer 11 in the shielding cover 10 is used as a part of the first resonant cavity antenna. The shielding cover 10 is integrated with the resonant cavity antenna, to provide extremely good structure consistency. An upper edge area of the second metal layer 20 in the resonant cavity antenna may be used as a support for another antenna, for example, may be used as a support for a near field communication (NFC) antenna, an ultra wide band (UWB) antenna, or a millimeter wave antenna, so that space is fully used. The resonant cavity antenna is implemented near the shielding cover 10 (with 0 clearance, low profile), so that extremely high radiation performance is provided, space for the entire electronic device is fully used, and more antennas are implemented.

Figures 1C, 1D:
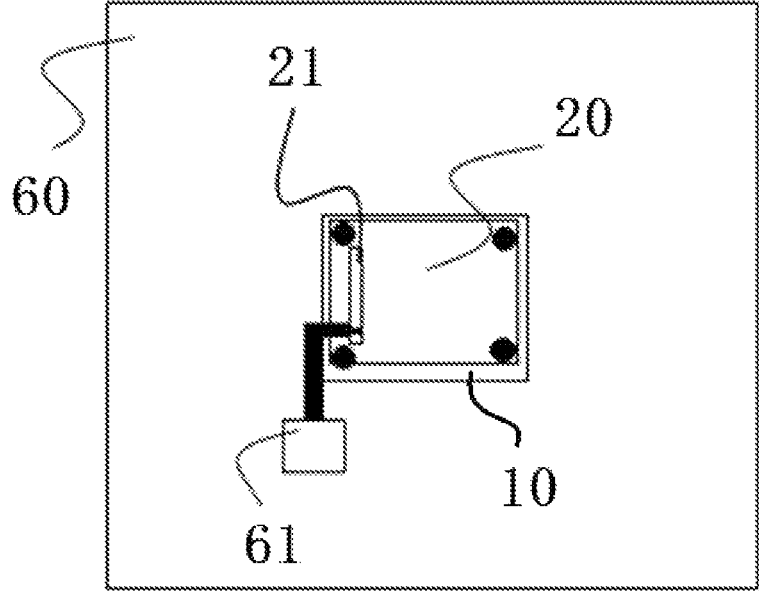
FIG. 1c is another schematic structural diagram of an electronic device according to an embodiment of this application.
FIG. 1d is another side view of an electronic device according to an embodiment of this application.

In some embodiments, as shown in FIG. 1b, the metal member 30 may extend in the circumferential direction of the second metal layer 20, and the metal member 30 may be located in an edge area of the first metal layer 11 and the edge area of the second metal layer 20. The metal member 30 may be circular or arc-shaped. The resonant cavity may be formed by the metal member 30 between the first metal layer 11 and the second metal layer 20 in a manner of enclosing. The resonant cavity may be cylindrical, rectangular-cuboid-shaped, or cube-shaped. As shown in FIG. 1d, there may be a plurality of metal members 30, and the metal members 30 may be columnar or arc-shaped. The plurality of metal members 30 may be spaced apart from each other in a circumferential direction of the second metal layer 20, or may be evenly spaced apart from each other. The resonant cavity may be enclosed by the plurality of metal members 30 in a manner of enclosing. The metal member 30 may be a non-closed annular metal sheet. As shown in a dashed line a in FIG. 6a, an opening may be provided on a part of a surface of the metal member 30, to implement mode adjustment and control of an antenna.

The first metal layer 11, the second metal layer 20, and the metal member 30 may not be formed integrally. The metal member 30 may be a metal elastic piece or a screw post. The first metal layer 11 and the second metal layer 20 may be two discrete structural members. A position of the elastic piece may be flexibly adjusted based on an actual debugging condition, and a resonance frequency of the resonant cavity antenna is controlled. Debugging is performed efficiently for a short period, which avoids a problem that debugging is not easy to perform because of the integrated antenna structure, that the antenna structure needs to be replaced entirely, and that a sample is made for a long period.

Figure 3:
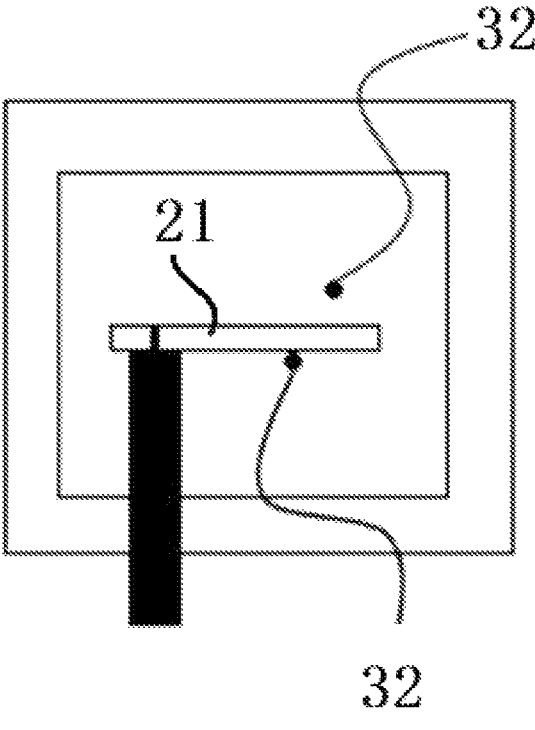
FIG. 3 is still another schematic structural diagram of an electronic device according to an embodiment of this application.

In some other embodiments, as shown in FIG. 3, the metal member 30 may include a first metal member and a second metal member 32. The first metal member may be electrically connected to the first metal layer 11 and the second metal layer 20 respectively. The first metal member may be disposed in a circumferential direction of the second metal layer 20, and forms a first resonant cavity in a manner of enclosing. The first metal member may extend in the circumferential direction of the second metal layer 20. The first metal member may be located in the edge area of the first metal layer 11 and the edge area of the second metal layer 20. The first metal member may be circular or arc-shaped. The first resonant cavity may be formed in a manner of enclosing by the first metal member between the first metal layer 11 and the second metal layer 20. The first resonant cavity may be cylindrical, rectangular-cuboid-shaped, or cube-shaped. There may be a plurality of first metal members, and the first metal members may be columnar or arc-shaped. The plurality of first metal members may be spaced apart from each other in the circumferential direction of the second metal layer 20, or may be evenly spaced apart from each other. The first resonant cavity may be formed by the plurality of first metal members in a manner of enclosing.

The second metal member 32 is electrically connected to the first metal layer 11 and the second metal layer 20 respectively. The second metal member 32 is disposed in the circumferential direction of the second metal layer 20 and forms a second resonant cavity in a manner of enclosing. The second resonant cavity is located in the first resonant cavity. The second metal member 32 may extend in the circumferential direction of the second metal layer 20. The second metal member 32 may be circular or arc-shaped. The second resonant cavity may be formed in a manner of enclosing by the second metal member 32 between the first metal layer 11 and the second metal layer 20. The second resonant cavity may be cylindrical, rectangular-cuboid-shaped, or cube-shaped. There may be a plurality of second metal members 32. The second metal member 32 may be cylindrical or arc-shaped. The plurality of second metal members 32 may be spaced apart from each other in the circumferential direction of the second metal layer 20, or may be evenly spaced apart from each other. The second resonant cavity may be formed by the plurality of second metal members 32 in a manner of enclosing. A plurality of high-order modes may be excited by using the first resonant cavity and the second resonant cavity, so that a frequency band covered by an antenna is expanded.

In an embodiment of this application, there may be a plurality of second metal members 32, and the second metal members 32 may be distributed on two sides of the slot 21. The second metal member 32 may be an elastic piece or a metal cylinder. The second metal member 32 is connected to the first metal layer 11 and the second metal layer 20, to implement antenna mode control and implement broadband coverage. The second metal member 32 is distributed on the two sides of the slot 21, so that the plurality of higher-order modes are excited for the antenna, and the frequency band covered by the antenna may be expanded.

Figure 4:
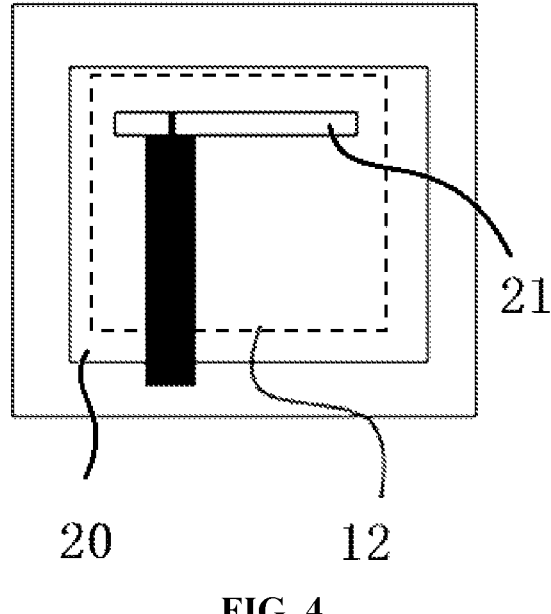
FIG. 4 is a schematic diagram of a filled dielectric layer.

In some embodiments, as shown in FIG. 4, a dielectric layer 12 is filled between the first metal layer 11 and the second metal layer 20. The dielectric layer 12 may be filled or partially filled in the resonant cavity, to reduce a resonance frequency of an antenna and reduce a length and width required for a cavity. Optionally, a loss tangent factor of the dielectric layer 12 may be less than 0.005.

Figure 9A:
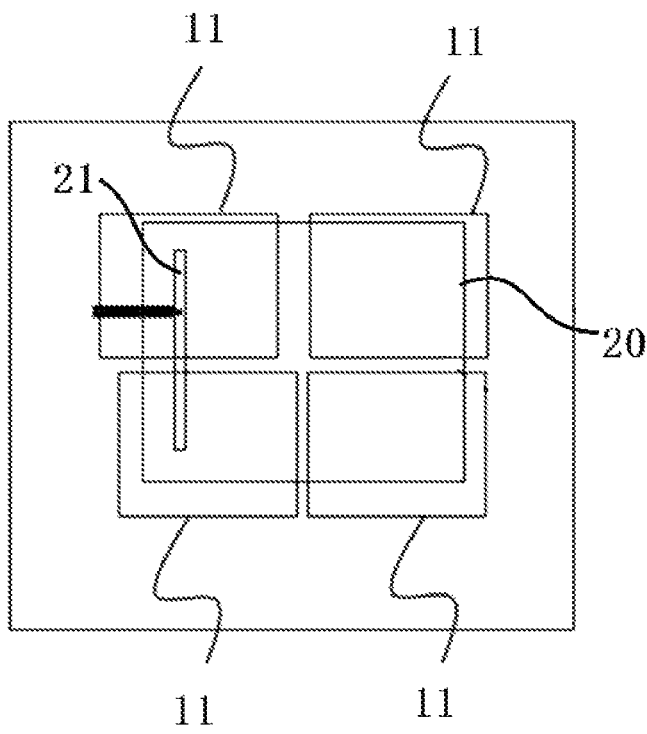
FIG. 9a is a schematic diagram when there are a plurality of shielding covers.
Figure 9B:
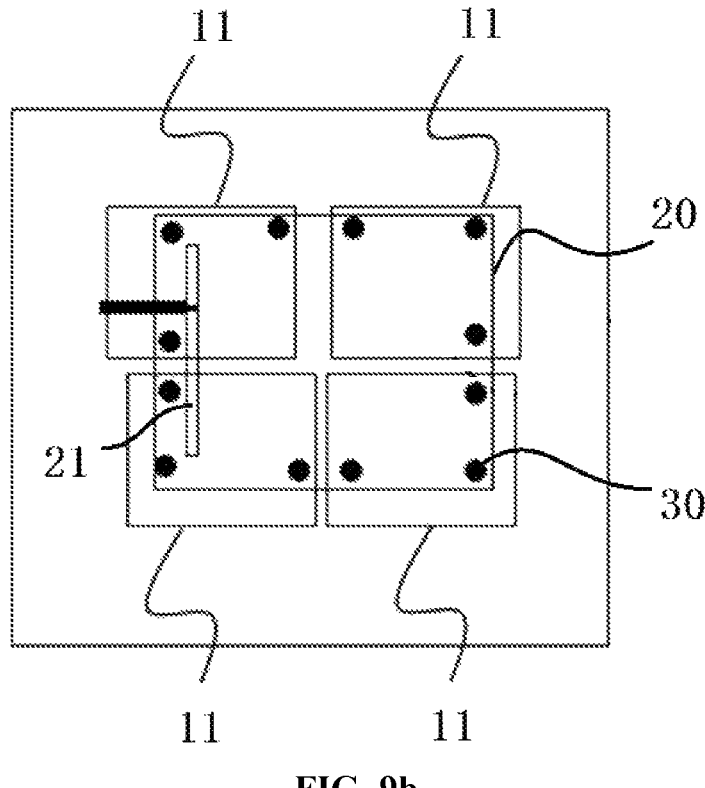
FIG. 9b is another schematic diagram when there are a plurality of shielding covers.
Figure 9C:
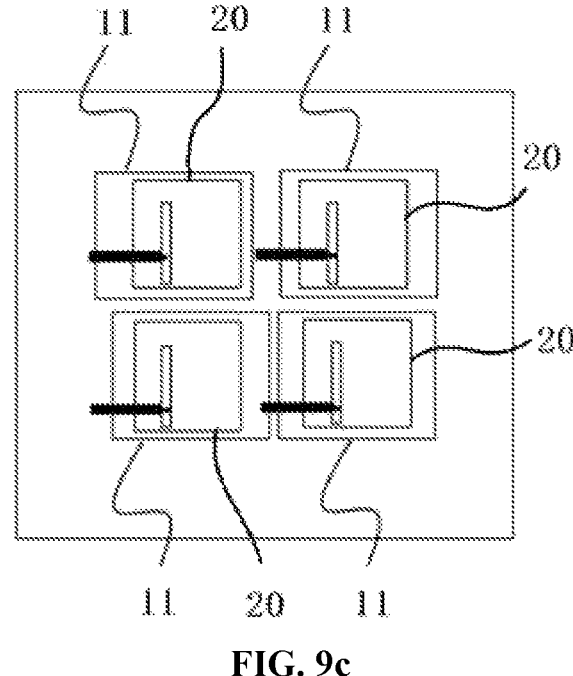
FIG. 9c is still another schematic diagram when there are a plurality of shielding covers.
Figure 9D:
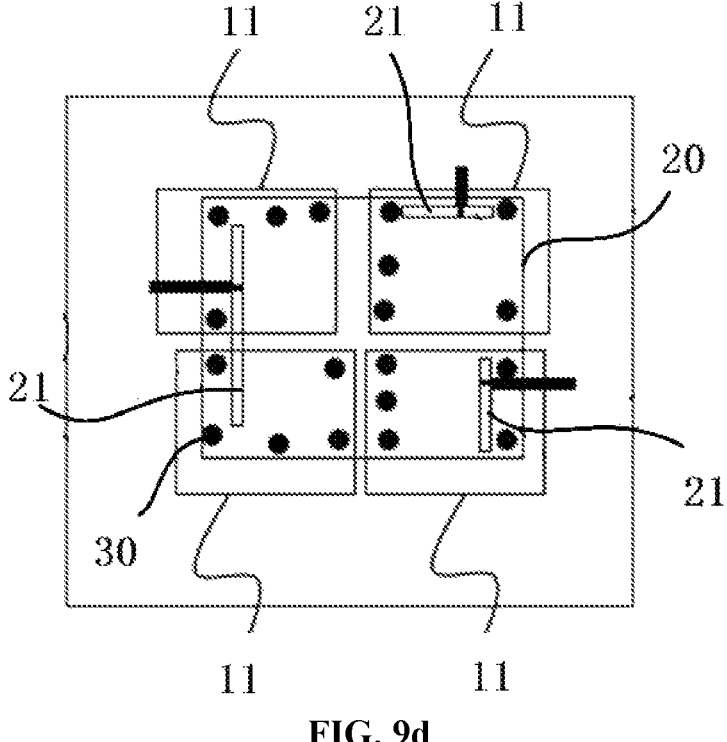
FIG. 9d is yet another schematic diagram when there are a plurality of shielding covers.

In an embodiment of this application, as shown in FIG. 9d, the second metal layer 20 may be provided with a plurality slots 21. The plurality of slots 21 may be distributed at intervals. Specific intervals may be selected based on an actual condition.

Figure 7A:
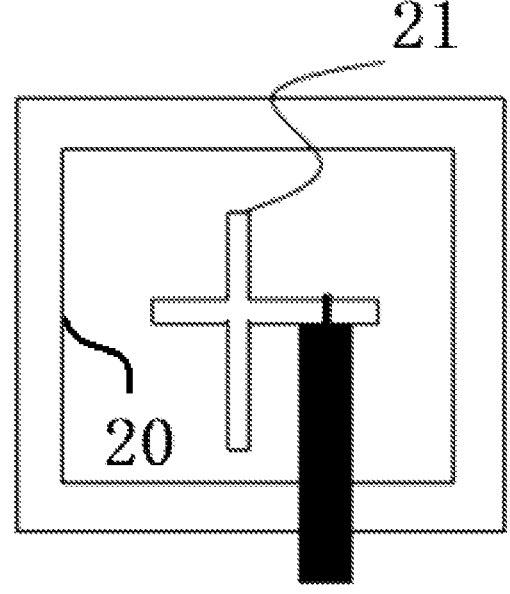
FIG. 7a is a schematic diagram of disposing of a slot.
Figure 7B:
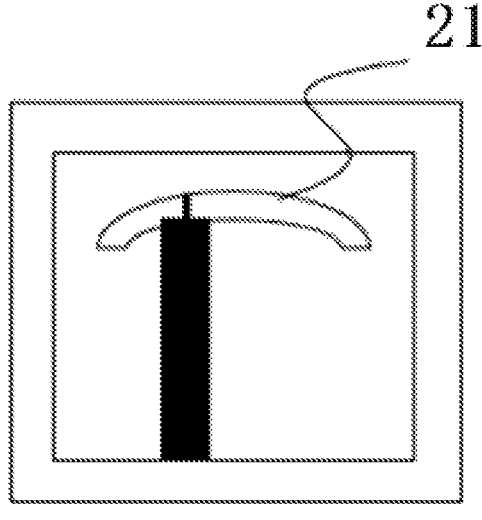
FIG. 7b is another schematic diagram of disposing of a slot.
Figure 7C:
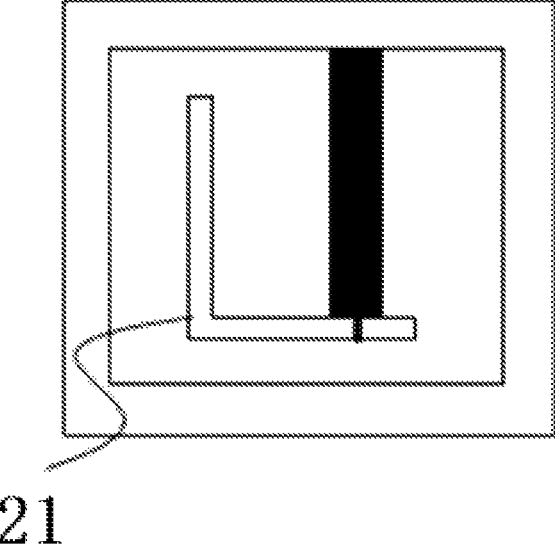
FIG. 7c is still another schematic diagram of disposing of a slot.

Optionally, as shown in FIG. 7a to FIG. 7c, the slot 21 may be strip-shaped, arc-shaped, annular, or L-shaped, and a plurality of slots 21 cross each other to form cross-shaped slots. For example, as shown in FIG. 7a, two strip-shaped slots 21 cross each other to form a cross shape, which may be specifically selected based on an actual situation. The slot 21 is used as a radiation caliber of an antenna, and a shape of the slot 21 is not limited to the foregoing shape.

Optionally, the slot 21 may be located at an edge area of the second metal layer 20, to facilitate radiation of the antenna. Another antenna may be easily disposed at a central area of the second metal layer 20. For example, the central area may be reserved to be used by a UWB antenna or millimeter wave antenna. Therefore, layout is more proper.

Figure 2A:
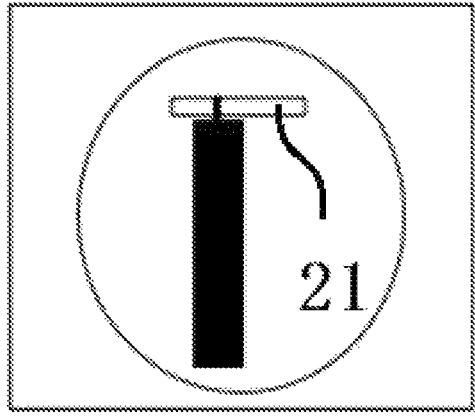
FIG. 2a is a schematic diagram of a shape of a resonant cavity.
Figure 2B:
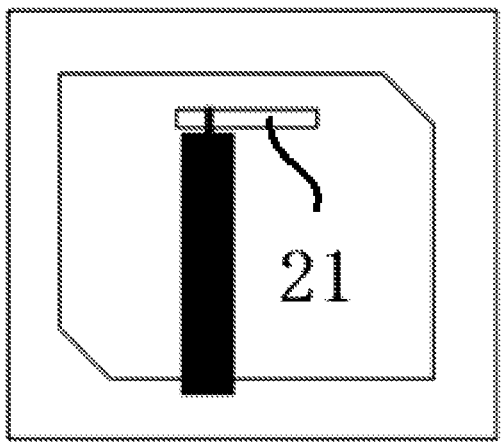
FIG. 2b is another schematic diagram of a shape of a resonant cavity.
Figure 2C:
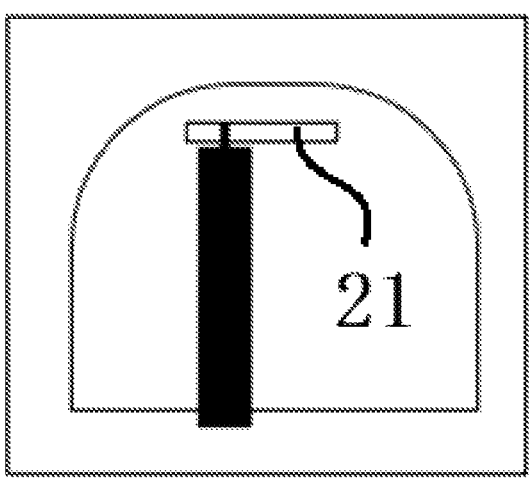
FIG. 2c is still another schematic diagram of a shape of a resonant cavity.

Optionally, as shown in FIG. 2a to FIG. 2c, the resonant cavity may be cylindrical, elliptic-cylinder-shaped, or poly-hedron-shaped, and the resonant cavity may be a cavity of another shape formed by an arc line and a straight line. For example, the resonant cavity may be rectangular-cuboid-shaped, or cube-shaped, which may be specifically selected based on an actual situation, and may be correspondingly designed and adjusted based on an actual antenna mode, a bandwidth, and the like.

In some embodiments, a length of the slot 21 may be half an operating wavelength of a radio frequency signal in a medium in the slot 21.

Optionally, the slot 21 is strip-shaped, and a ratio of the length of the slot 21 to a width of the slot 21 may be greater than or equal to 10.

Figure 6A:
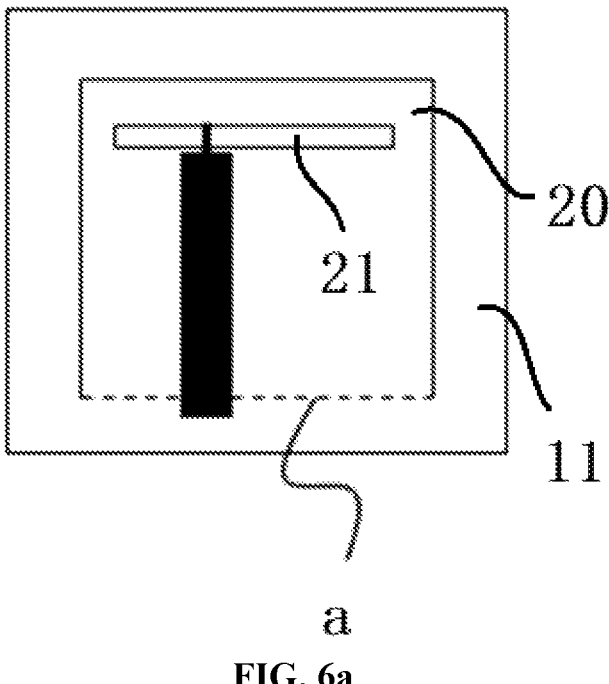
FIG. 6a is a schematic diagram of a metal member that is not closed.
Figure 6B:
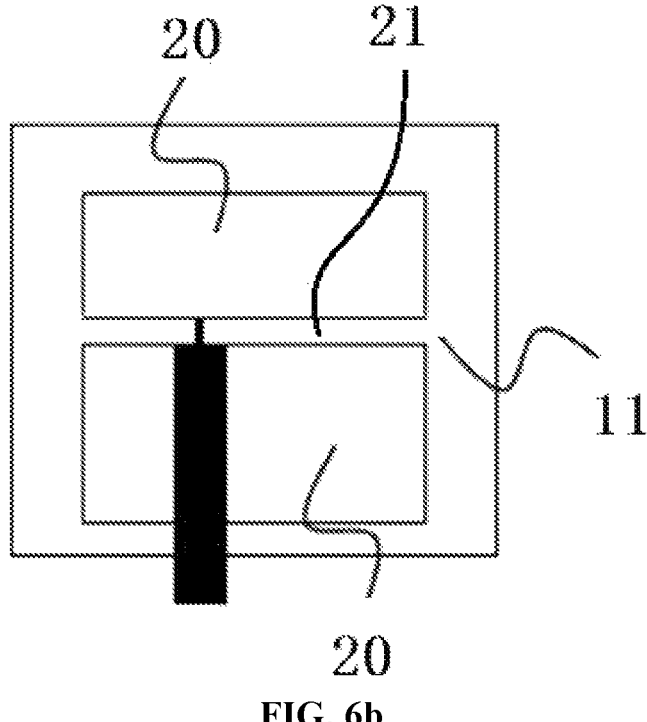
FIG. 6b is a schematic diagram of a slot that penetrates.

Optionally, as shown in FIG. 6b, the slot 21 may extend inwardly from one side edge of the second metal layer 20 and penetrate from the other side edge of the second metal layer 20. A part, provided with a slot, of the second metal layer 20 may extend to an edge, and the second metal layer 20 may be separated into two parts, so that a resonant cavity is divided into two half cavities. Sizes of the two half cavities may be equal or different, so that multi-frequency resonance may be implemented, and antenna impedance tuning may be performed.

Figure 5A:
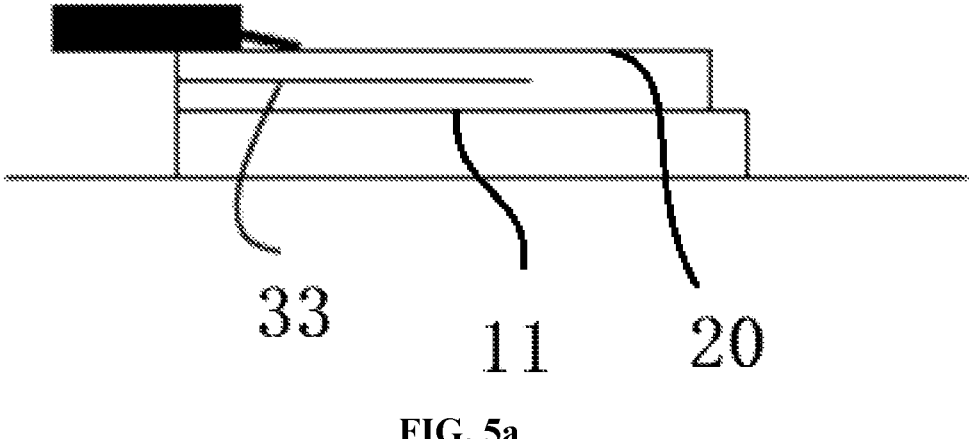
FIG. 5a is a schematic diagram of disposing of a third metal layer.
Figure 5B:
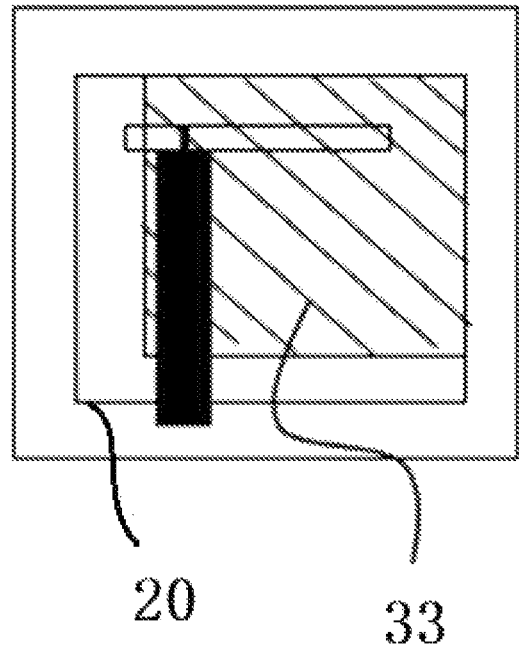
FIG. 5b is another schematic diagram of disposing of a third metal layer.

In some embodiments, as shown in FIG. 5a and FIG. 5b, the electronic device may further include a third metal layer 33. The third metal layer 33 may be disposed between the first metal layer 11 and the second metal layer 20, and the third metal layer 33 is located in the resonant cavity. The third metal layer 33 may be spaced apart from the first metal layer 11 and the second metal layer 20 separately. The third metal layer 33 may be parallel to the first metal layer 11 and the second metal layer 20 separately. An edge of the third metal layer 33 may be electrically connected to the metal member 30. The metal member 30 may extend in the circumferential direction of the second metal layer 20. The third metal layer 33 may be rectangular-shaped. The first metal layer 11, the second metal layer 20, and the third metal layer 33 each may be rectangular-shaped. The resonant cavity may be rectangular-cuboid-shaped. Both of two adjacent edges of the third metal layer 33 may be electrically connected to the metal member 30, and the other two adjacent edges of the third metal layer 33 are not electrically connected to the metal member 30, and may be spaced apart from the metal member 30. The third metal layer 33 is parallel to the first metal layer 11 and the second metal layer 20, and the third metal layer 33 may be connected to two surfaces of the resonant cavity, and is not connected to the other two surfaces, to form an L-shaped cavity part. One third metal layer 33 may be added to the inside of the resonant cavity, to implement folding of the resonant cavity, reduce an antenna resonance frequency, and reduce a length and width required for the cavity.

In some embodiments, as shown in FIG. 9c, there may be a plurality of shielding covers 10, and there may be a plurality of second metal layers 20. The first metal layer 11 of each shielding cover 10 and one corresponding second metal layer 20 form the first resonant cavity antenna. For example, there may be four shielding covers 10, and there may be four second metal layers 20. The first metal layer 11 of each shielding cover 10 and one corresponding second metal layer 20 form the first resonant cavity antenna, that is, four first resonant cavity antennas are formed. The metal member 30 is disposed between the first metal layer 11 of each shielding cover 10 and the corresponding second metal layer 20, and the metal member 30 may form a resonant cavity in a manner of enclosing. The slot 21 is provided on the second metal layer 20, and the first metal layer 11 of each shielding cover 10 and the second metal layer 20 form the first resonant cavity antennas respectively, so that an antenna with high radiation efficiency may be disposed above the shielding cover 10. A resonant cavity antenna is integrally designed above each shielding cover 10, and a plurality of shielding covers 10 may be corresponding to a plurality of resonant cavity antennas. These resonant cavity antennas may operate in a same frequency band to implement a multiple input multiple output (MIMO) antenna function, or operate in different frequency bands for a diversity antenna or MIMO antenna function with antennas of another type.

In some other embodiments, as shown in FIG. 9a and FIG. 9b, there may be a plurality of shielding covers 10, for example, four, and there may be one second metal layer 20. All first metal layers on the plurality of shielding covers 10 and the second metal layers 20 are disposed correspond-ingly, to form the first resonant cavity antenna. For example, there are four shielding covers 10, and there is one second metal layer 20. The second metal layer 20 may be rectan-gular-shaped. The four shielding covers 10 may be respec-tively located at corners of the second metal layer 20. The first metal layers 11 on the four shielding covers 10 and the second metal layers 20 are disposed correspondingly, to form the first resonant cavity antennas.

As shown in FIG. 9a and FIG. 9b, the first metal layers 11 on the plurality of shielding covers 10 are jointly corre-sponding to one large second metal layer 20, to cope with a situation in which an operation frequency of an antenna needs to be relatively low. The metal members 30, such as metal elastic pieces, may be disposed above the plurality of shielding covers 10. The metal member 30 may be electri-cally connected to the second metal layer 20 to form one first resonant cavity antenna, to cope with the situation in which the operation frequency of the antenna needs to be relatively low. In this implementation, debugging is relatively more flexible. The metal member 30 may be a screw post, and the first metal layer 11 on the shielding cover 10 may be electrically connected to the second metal layer 20 in a screw locking manner.

In an embodiment of this application, as shown in FIG. 9d, a plurality of resonant cavities may be formed between the first metal layer 11 and the second metal layer 20, for example, three resonant cavities. Slots 21 are respectively disposed at positions, corresponding to the resonant cavities, of the second metal layer 20, to implement flexible layout of the plurality of antennas. The metal members 30 may be disposed above the plurality of shielding covers 10, and the metal members 30 may be metal elastic pieces. Through reasonable layout of the elastic pieces, the first metal layer 11 is electrically connected to the second metal layer 20, and different resonant cavities are formed by division. Three slots 21 may be provided on the second metal layer 20 to be respectively corresponding to antenna radiation calibers of the resonant cavities, thereby implementing flexible layout of the plurality of antennas. For example, there are four shielding covers 10, and there is one second metal layer 20. The second metal layer 20 may be rectangular-shaped. The four shielding covers 10 may be respectively located at corners of the second metal layer 20. Three resonant cavities are formed between the first metal layers 11 on the four shielding covers 10 and the second metal layer 20 respectively, and a slot 21 may be disposed at a position, corresponding to each resonant cavity, on the second metal layer 20, to implement flexible layout of the plurality of antennas.

In some embodiments, as shown in FIG. 1a to FIG. 1d, the electronic device may further include a feeding structure 40. The feeding structure 40 is configured to feed the resonant cavity. The feeding structure 40 may include a coaxial line. The resonant cavity may be fed by using one coaxial line. One end of the coaxial line may be connected to a baseband and the radio frequency module 61. An inner core of the other end of the coaxial line may be connected to one side of the slot 21, and an outer grounding layer may be connected to the other side of the slot 21.

Figure 8:
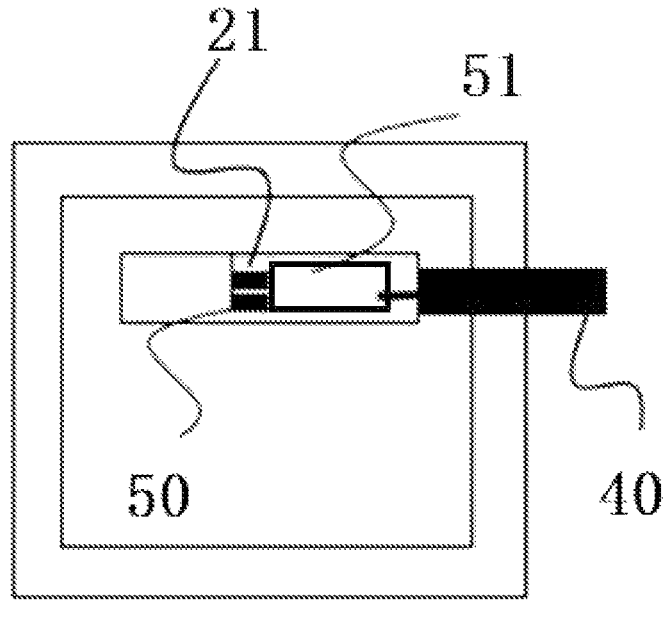
FIG. 8 is a schematic diagram of connection between a tuning element and a feeding structure.

The slot 21 of the resonant cavity antenna may perform feeding in a coupling feeding manner by using a flexible circuit board 51, or the second metal layer 20 may be fed in a coupling feeding manner through the flexible circuit board 51. As shown in FIG. 8, the coaxial line in the feeding structure 40 may be connected to the flexible circuit board 51, and an end of the flexible circuit board 51 may be electrically connected to one end of a tuning element 50, and the other end of the tuning element 50 is connected to one side of the slot 21, so that an antenna adjustment freedom can be increased. A shape of the flexible circuit board 51 and a value of an electronic element are modified, to implement multi-frequency tuning and optimize antenna impedance, making debugging more flexible.

In some embodiments, as shown in FIG. 8, the electronic device may further include the tuning element 50. The feeding structure 40 feeds the resonant cavity by using the tuning element 50. The tuning element may include the electronic element. The electronic element may be a capacitor, an inductor, or a switch component. There are no less than two electronic elements. Multi-frequency tuning can be implemented by using the tuning element, and antenna impedance can be optimized.

Figure 10:
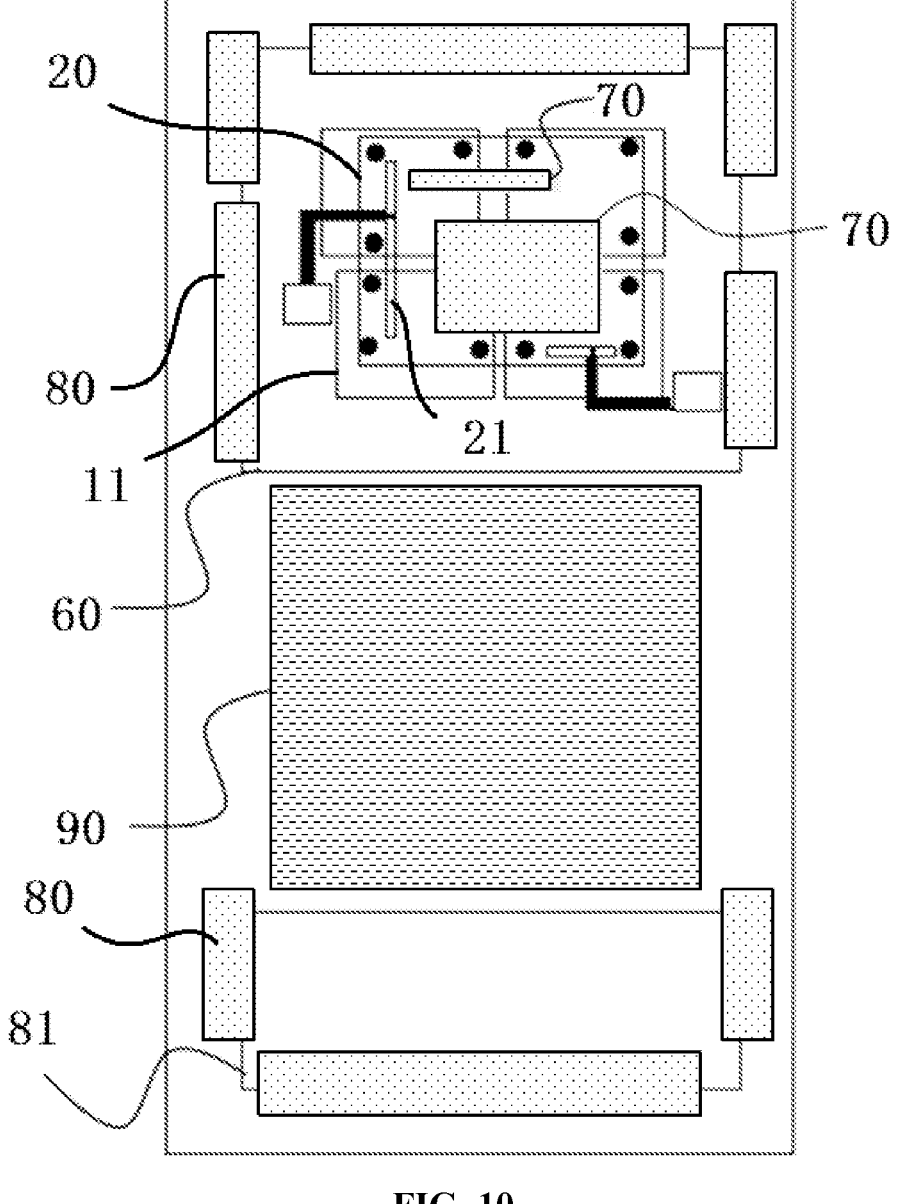
FIG. 10 is yet another schematic structural diagram of an electronic device according to an embodiment of this application.

Optionally, as shown in FIG. 1a, FIG. 1c, and FIG. 10, the electronic device may further include a main board 60. The shielding cover 10 may be disposed on the main board 60. The shielding cover 10 may be soldered on a main grounding layer of the main board 60, and may perform electromagnetic shielding on a chip module or a discrete power amplifier component on the main board 60. The first metal layer 11 may be located at the top of the shielding cover 10, that is, a side away from the main board.

In some embodiments, as shown in FIG. 10, the electronic device may further include a first antenna 70. The first antenna 70 may be disposed on the second metal layer 20. The shielding cover 10 may be located in a middle of the main board 60, and may be located at a position at which a chip shielding cover is located. Because a radiation caliber (at a slot) is on an edge of the second metal layer 20, actual occupied space is extremely small, and it may be considered that the entire structure is reused. In addition, the second metal layer 20 may further be used as a support. The second metal layer 20 may be used as a support for the first antenna 70. The first antenna 70 may include at least one of a UWB antenna, an NFC antenna, and a millimeter wave antenna. In this way, an antenna may be additionally disposed at an area in which a conventional antenna design is forbidden, thereby improving spatial utilization.

In some other embodiments, as shown in FIG. 10, the electronic device may further include second antennas 80. The second antenna 80 may be disposed at an edge area of the electronic device. The second antenna 80 may include an antenna in a frequency band less than 6 GHz such as a cellular antenna and a WiFi antenna. The second antenna 80 is arranged at an edge position of the electronic device to facilitate radiation, thereby improving antenna performance. The electronic device may further include a flexible circuit board 81. For example, the second antenna 80 may be fed through the flexible circuit board 81.

In some embodiments, as shown in FIG. 10, the electronic device may further include a battery 90 and a back cover. The battery 90 and the back cover may be spaced apart from each other in a thickness direction of the battery 90. A second resonant cavity antenna may be disposed between the battery 90 and the back cover, and a metal layer on the battery 90 may be used to form the second resonant cavity antenna. Space between the battery 90 and the back cover may be fully used, thereby improving space utilization, increasing a quantity of antennas, and improving entire antenna performance.

In some other embodiments, the electronic device may further include a display screen and a frame. The display screen may be disposed on the frame, and a third resonant cavity antenna may be disposed between the display screen and the frame, so that space between the display screen and the frame may be fully used, space utilization is improved, a quantity of antennas may be increased, and the overall antenna performance can be enhanced.

The embodiments of this application are described above with reference to the accompanying drawings, but this application is not limited to the foregoing implementations, and the foregoing specific implementations are only illustrative and not restrictive. Under the enlightenment of this application, a person of ordinary skill in the art can make many forms without departing from the purpose of this application and the protection scope of the claims, all of which fall within the protection of this application.

The invention claimed is:

1. An electronic device, comprising:
a shielding cover, wherein the shielding cover is provided with a first metal layer;
a second metal layer, wherein the second metal layer is spaced apart from the first metal layer, a slot is provided on the second metal layer, and the second metal layer is disposed outside the shielding cover;
a metal member, wherein the metal member is disposed between the first metal layer and the second metal layer, the metal member forms a resonant cavity in a manner of enclosing, the metal member is electrically connected to the first metal layer and the second metal layer separately, and the first metal layer and the second metal layer form a first resonant cavity antenna; and
a feeding structure, wherein the feeding structure is configured to feed the resonant cavity;
wherein the first metal layer, the second metal layer and the metal member are not formed integrally, and the metal member is a metal elastic piece or a screw post;
wherein
there are a plurality of shielding covers, there are a plurality of second metal layers, and a first metal layer of each shielding cover and one corresponding second metal layer form one of the first resonant cavity antennas; or there are a plurality of shielding covers, there is one second metal layer, and first metal layers on the plurality of shielding covers are all disposed corresponding to the second metal layer to form the first resonant cavity antennas respectively.

2. The electronic device according to claim 1, wherein the metal member extends in a circumferential direction of the second metal layer; or there are a plurality of metal members, and the plurality of metal members are spaced apart from each other in a circumferential direction of the second metal layer.

3. The electronic device according to claim 1, wherein the metal member comprises:

a first metal member, wherein the first metal member is electrically connected to the first metal layer and the second metal layer separately, and the first metal member is disposed in a circumferential direction of the second metal layer, and forms a first resonant cavity in a manner of enclosing; and a second metal member, wherein the second metal member is electrically connected to the first metal layer and the second metal layer separately, the second metal member is disposed in the circumferential direction of the second metal layer and forms a second resonant cavity in a manner of enclosing, and the second resonant cavity is located in the first resonant cavity.

4. The electronic device according to claim 3, wherein there are a plurality of second metal members, and the second metal members are distributed on two sides of the slot.

5. The electronic device according to claim 1, wherein a dielectric layer is filled between the first metal layer and the second metal layer.

6. The electronic device according to claim 1, wherein the slot is strip-shaped, and a ratio of a length of the slot to a width of the slot is greater than or equal to 10.

7. The electronic device according to claim 1, further comprising:

a third metal layer, wherein the third metal layer is disposed between the first metal layer and the second metal layer and is located in the resonant cavity, the third metal layer is spaced apart from the first metal layer and the second metal layer separately, and an edge of the third metal layer is electrically connected to the metal member.

8. The electronic device according to claim 7, wherein the metal member extends in a circumferential direction of the second metal layer, the third metal layer is rectangular-shaped, and two adjacent edges of the third metal layer are both electrically connected to the metal member.

9. The electronic device according to claim 1, wherein a plurality of the resonant cavities are formed between the first metal layer and the second metal layer, and the slots are respectively disposed at positions, corresponding to the resonant cavities, on the second metal layer.

10. The electronic device according to claim 1, further comprising:

a tuning element, wherein the feeding structure feeds the resonant cavity by using the tuning element.

11. The electronic device according to claim 1, further comprising:

a main board, wherein the shielding covers are disposed on the main board.

12. The electronic device according to claim 1, further comprising:

a first antenna, wherein the first antenna is disposed on the second metal layer.

* * * * *